(12) United States Patent
Coutelou et al.

(10) Patent No.: US 8,768,341 B2
(45) Date of Patent: Jul. 1, 2014

(54) WIRELESS CURRENT SENSOR

(75) Inventors: Olivier Coutelou, Grenoble (FR);
Bertrand Masseboeuf, Beaucroissant (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 199 days.

(21) Appl. No.: 13/437,257

(22) Filed: Apr. 2, 2012

(65) Prior Publication Data

US 2012/0302182 A1     Nov. 29, 2012

(30) Foreign Application Priority Data

May 24, 2011   (FR) ...................................... 11 54516

(51) Int. Cl.
*H04W 24/00*          (2009.01)
(52) U.S. Cl.
USPC ..................... 455/423; 455/115.1; 455/67.11; 455/67.13; 340/501
(58) Field of Classification Search
USPC ............. 455/423, 115.1, 67.11, 67.13, 226.1; 340/501, 539.1, 506
See application file for complete search history.

(56) References Cited

U.S. PATENT DOCUMENTS

| | | | |
|---|---|---|---|
| 6,018,700 A | | 1/2000 | Edel |
| 2008/0278310 A1* | | 11/2008 | Kates ......................... 340/539.1 |
| 2008/0303654 A1* | | 12/2008 | Kates ......................... 340/539.3 |
| 2008/0309480 A1* | | 12/2008 | Youn et al. ................. 340/539.3 |
| 2009/0002151 A1* | | 1/2009 | Ferri et al. ................. 340/539.1 |
| 2010/0264906 A1 | | 10/2010 | Shamir et al. |
| 2010/0318306 A1 | | 12/2010 | Tierney et al. |

FOREIGN PATENT DOCUMENTS

| | | |
|---|---|---|
| EP | 1 703 289 A1 | 9/2006 |
| WO | WO 99/43010 | 8/1999 |
| WO | WO 2008/142425 A1 | 11/2008 |

OTHER PUBLICATIONS

French Preliminary Search Report and Written Opinion issued on Jan. 20, 2012 in corresponding French Application No. 11 54516 filed on May 24, 2011 (with an English Translation of Categories).

* cited by examiner

*Primary Examiner* — Minh D Dao
(74) *Attorney, Agent, or Firm* — Oblon, Spivak, McClelland, Maier & Neustadt, L.L.P.

(57) ABSTRACT

A wireless current sensor for measuring an electrical current flowing in an electrical conductor comprising a current transformer including a core arranged around the electrical conductor and forming a primary of the current transformer, and a winding around the core and forming a secondary of the current transformer in order to retrieve an electrical power when an electrical current flows in the electrical conductor, and an electronic circuit connected to the secondary of the current transformer, the electronic circuit including means for storing the generated electrical power, means for measuring the electrical current flowing in the electrical conductor, and a wireless data transceiver coupled to a microcontroller to send the measurement data.

11 Claims, 3 Drawing Sheets

WIRELESS CURRENT SENSOR

TECHNICAL FIELD OF THE INVENTION

The present invention relates to a wireless current sensor making it possible to measure the electrical current flowing in an electrical conductor. The current sensor of the invention makes it possible to measure the current flowing in an electrical conductor and to transmit measurement data to a remote central station. The current sensor of the invention has the advantage of being autonomous in electrical power by being supplied by induction by virtue of the electrical current flowing in the electrical conductor.

DESCRIPTION OF THE PRIOR ART

Current sensors that are wireless and autonomous in electrical power are known from documents WO2008/142425 or WO2010/119332. These documents propose solutions making it possible to measure the electrical current flowing in an electrical conductor. For this, they comprise a torus that is furnished with a winding and is arranged around the electrical conductor, the electrical conductor forming the primary of a transformer and the winding the secondary of the transformer. This arrangement allows both the measurement of the electrical current flowing in the conductor and the generation of an electrical power designed to supply an electronic measurement circuit. These solutions make provision for transmitting the measurement data of the electrical current by using a wireless transmitter coupled to a remote central station.

The object of the invention is to propose a wireless current sensor that is furnished with a single torus and is autonomous in electrical power which makes it possible to optimize the time for measuring the electrical current as a function of the available electrical power.

SUMMARY OF THE INVENTION

This object is achieved by a wireless current sensor designed for measuring an electrical current flowing in an electrical conductor, the said wireless current sensor comprising:
- a current transformer comprising a core designed to be arranged around the said electrical conductor forming a primary of the said transformer, and a winding made around the core and forming a secondary of the said transformer in order to retrieve an electrical power when an electrical current flows in the electrical conductor,
- an electronic circuit connected to the secondary of the transformer, the electronic circuit comprising:
  - means for storing the generated electrical power,
  - means for measuring the electrical current flowing in the electrical conductor comprising a microcontroller supplied by virtue of the electrical power stored in the means for storing electrical power and making it possible to generate measurement data of the electrical current flowing in the electrical conductor,
  - a wireless data transceiver coupled to the said microcontroller and making it possible to send the measurement data,
- at least two distinct operating modes, the two operating modes differing from one another by the measurement data generated by the microcontroller and by the duration of measurement of the electrical current flowing in the electrical conductor,
- means for determining the transition from one operating mode to the other taking account of a value of the said measured electrical current.

According to one particular feature, the current sensor comprises means for detecting a sudden reduction in the value of the measured electrical current and means for activating the wireless transceiver in order to send the measurement data when the sudden reduction is detected.

According to another particular feature, the means for storing power comprise a voltage doubler device comprising two capacitors and two diodes.

According to another particular feature, the core of the transformer takes the form of a torus designed to be positioned around the electrical conductor.

According to a first embodiment, the electronic circuit comprises means for selecting between a charging mode in which the electrical power is stored in the means for storing electrical power and a measuring mode in which the electrical power is used to measure the electrical current, determine the measurement data and send the measurement data.

According to one particular feature of this first embodiment, the selection means take the form of two transistors connected together via their respective drain and each furnished with a diode mounted between the drain and the source.

According to another particular feature of this first embodiment, the measurement means comprise a measurement resistor connected in series with the two transistors and in parallel with the means for storing electrical power.

According to a second embodiment, the measurement means comprise a measurement resistor connected in series with the means for storing electrical power. This embodiment therefore does not comprise selection means for selecting between a measuring mode and a charging mode.

According to one particular feature of this second embodiment, the wireless current sensor comprises an operating mode designed for the detection of a current defect. This operating mode is allowed only for the second embodiment because it assumes being able to measure the current permanently.

According to the invention, in a determined operating mode, the current sensor is arranged to switch, for a determined period, the wireless transceiver into receiving mode after a transmission of measurement data, in order to receive data originating from the central station.

BRIEF DESCRIPTION OF THE FIGURES

Other features and advantages will appear in the following detailed description made with respect to the appended drawings in which.

DETAILED DESCRIPTION OF AT LEAST ONE EMBODIMENT

The invention relates to a current sensor that is wireless and entirely autonomous in power.

Figure 1:
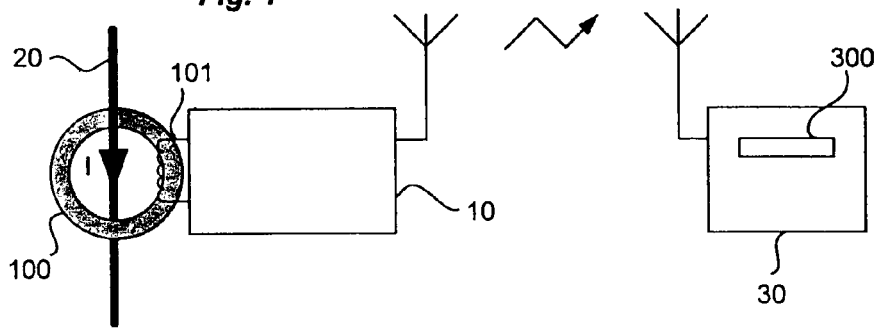
FIG. 1 represents schematically a system comprising the wireless current sensor of the invention and a remote central station designed to collect the current measurement data.

With reference to FIG. 1, the wireless current sensor 10 of the invention is designed to measure the electrical current I flowing in an electrical conductor 20. It takes the form of a module being attached to the electrical conductor and making it possible, by virtue of measurement means, to determine measurement data associated with the electrical AC current flowing in the electrical conductor and, by virtue of transmission means, to send the measurement data to a remote central station 30. The central station 30 comprises for example a display 300 designed to display the measurement data or any other information.

In the rest of the description, "electrical current measurement data" means any data associated with the electrical AC current flowing in the electrical conductor 20, such as for example:
- the effective value of the mean current that flows in the electrical conductor 20,
- the effective value of the minimum current that flows in the electrical conductor 20 over a given measurement period,
- the effective value of the maximum current that flows in the electrical conductor over a given measurement period,
- the level of the fundamental frequency of the current I that flows in the electrical conductor 20,
- the level of the $2^{nd}$, $3^{rd}$, $4^{th}$, $5^{th}$ order harmonics (or even more if necessary) of the current that flows in the electrical conductor 20,
- the current harmonic distortion ratio THDi,
- the presence of a current defect (overvoltage followed by a transition to zero of the electrical current),
- a moment of transition to zero current allowing for example the central station 30 to compute the power factor (cos phi), then allowing the current sensor 10 to refine an assessment of total power passing through the electrical conductor 20. For the central station 30 to determine the power factor, the radio transmission of the current sensor 10 must be synchronized with the transition to zero of the current. Specifically, based on the information concerning the moment of transition to zero of the current and on the information concerning the moment of transition to zero of the power supply voltage applied to the electrical conductor and known to the central station 30, the central station 30 can thus determine the power factor.

In the rest of the description, the data transmission means correspond to a wireless transceiver E/R used to both send and receive data.

The current sensor 10 of the invention comprises more precisely a core taking the form of a torus 100 designed to be traversed by the electrical conductor 20 the current of which is intended to be measured. A winding 101 is made around the said torus 100. The torus is for example able to open, which allows it to be positioned around the electrical conductor 20. When the current sensor 10 is in position on the electrical conductor 20, the electrical conductor 20 then forms the primary of a current transformer and the winding 101 forms the secondary of the said current transformer. By virtue of this architecture, the current flowing in the secondary of the current transformer is the image of the current I flowing in the primary of the transformer.

In the rest of the description, the electrical current measured is the current flowing in the secondary of the transformer but it should be understood that it corresponds to the primary current I flowing in the electrical conductor 20 since it is the image of the primary current.

The current sensor 10 of the invention also comprises an electronic circuit enclosed in its module and directly connected to the two winding wires 101 of the secondary. This electronic circuit comprises means for storing electrical power generated by virtue of the current transformer, the aforementioned measurement means and wireless transceiver that are supplied by the electrical power stored in the means for storing electrical power. The measurement means comprise a microcontroller UC associated with two linear voltage regulators LDO and notably making it possible to determine the measurement data to be sent to the central station 30 and to manage the transmission of these measurement data over time as a function of pre-established operating rules stored in the current sensor 10. The measurement means also comprise a measurement resistor Rm, preferably of low value (for example equal to 1 ohm). The wireless transceiver E/R is for example of the radio frequency type. Any other wireless technology may of course be envisaged.

Figure 2:
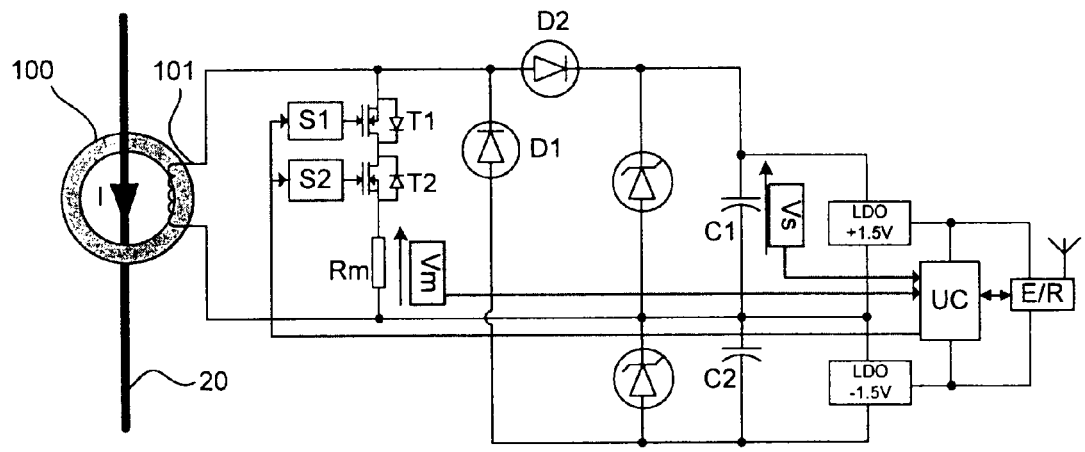
FIG. 2 represents an electronic diagram of the current sensor of the invention according to a first embodiment.
Figure 4:
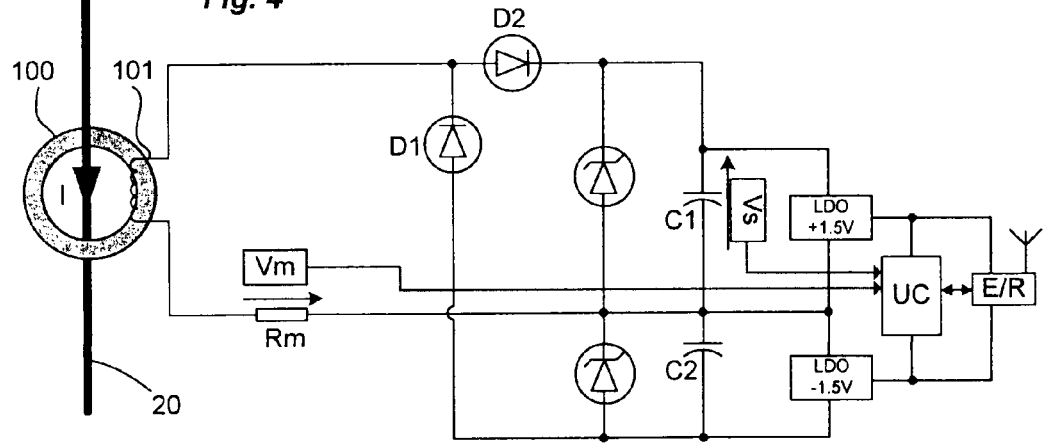
FIG. 4 shows an electronic diagram of the current sensor of the invention according to a second embodiment.

According to the invention, the electronic circuit may take the form of two distinct assemblies shown in FIGS. 2 and 4.

In the two proposed assemblies, the measurement of the electrical current I is not always permanent. Depending on the operating mode applied, the period of current measurement may vary. This measurement period varies depending on the effective value of the electrical current I measured in the electrical conductor 20 and on the value of the voltage measured at the terminals of the means for storing electrical energy.

The first assembly shown in FIG. 2 shows the particular feature of operating discontinuously between a charging mode and a measuring mode. In charging mode, the secondary current travels into the means for storing electrical power but not through the measurement resistor Rm. In measuring mode, the secondary current passes through the measurement resistor Rm but not the means for storing electrical power. The sensor therefore comprises selection means for choosing between the measuring mode and the charging mode. The measurement data are preferably sent when the current sensor is in charging mode.

More precisely, this first assembly comprises a circuit loop containing the measurement resistor Rm and a switch forming the selection means, and a second circuit loop assembled in parallel with the first circuit loop and containing the means for storing electrical power. On the first circuit loop, the switch is assembled in series with the measurement resistor. When the switch is in the closed state, the secondary current travels into the first circuit loop, that is to say through the measurement resistor Rm, and when it is in the open state, the secondary current travels via the second circuit loop and is used to charge the means for storing electrical power. The switch consists for example of two transistors T1, T2 of the N-channel MOSFET type connected together in series via their respective drain. Each MOSFET transistor is furnished with a diode mounted between its drain and its source. The two diodes are oriented in opposite directions. The two transistors T1, T2 are each controlled by control signals S1, S2 sent by the microcontroller UC. This assembly makes it possible to manage the two alternations of the secondary current. The means for storing electrical power consist for example of two capacitors C1, C2 and two diodes D1, D2 arranged together in the form of a "Latour" voltage doubler making it possible to retrieve the electrical power generated during the positive alternation of the electrical current in one of the two capacitors and to retrieve the electrical power generated during the negative alternation of the electrical current in the other capacitor. The two linear voltage regulators LDO connected in parallel with the capacitors C1, C2 make it possible for each to deliver a constant voltage to the microcontroller UC and to the wireless transceiver E/R. When the switch is controlled to the closed state by the microcontroller, an item of information on the measurement of the voltage at the terminals of the measurement resistor Rm allows it to deduce the effective value of the electrical current. An item of information on the value Vs of the voltage at the terminals of one of the capacitors C1 is also sent periodically to the microcontroller UC in order to permanently monitor the available electrical power. These two items of information are used by the microcontroller UC to select the operating mode of the current sensor 10, certain operating modes differing from one another by the duration of measurement over a determined period of time and by the measurement data generated. The current sensor may specifically switch from one operating mode to another while taking account only of the electrical current I that is measured.

The advantage of this first assembly is that, in measuring mode, the wave form of the voltage at the terminals of the measurement resistor Rm is a faithful image of the current I that flows in the electrical conductor 20. Specifically, because of the low value of the measurement resistor Rm, in measuring mode, the secondary of the current transformer is in a configuration that is close to short circuit. This assembly is therefore perfectly suited to the measurement of the harmonics of the current I and to the control of the phase shift between the primary and the secondary of the current transformer.

For this first assembly shown in FIG. 2, when the current can never be permanently measured, one operating cycle of the sensor comprises:
charging time for the means for storing electrical power,
order of conduction of the transistors T1, T2,
stabilization time of the measured current,
current measurement time,
order of opening of the transistors,
radio transmission time.

For this first assembly, the following operating modes can be distinguished:

Mode 0—I≈0
The electrical current I flowing in the electrical conductor 20 is too low to be able to supply the electronic circuit of the current sensor 10.

Mode 1—2≤I≤5 A
The electrical current I flowing in the electrical conductor 20 is low but sufficient for supplying the electronic circuit of the sensor 10, with the exception of the analog to digital converter (ADC).
No current measurement is taken.
Periodic transmission by the wireless transceiver E/R that a low current is flowing in the electrical conductor 20.

Mode 2—5≤I≤7 A
The electrical current I flowing in the electrical conductor 20 becomes sufficient to supply the electronic circuit, including the analog to digital converter (ADC).
The electrical current I is measured over, for example, 30% of the operating cycle Te of the current sensor 10 (for example Te=2 s).
Each time the voltage Vs at the terminals of the capacitor C1 is above a determined threshold, for example equal to 5.1 V, the electrical current I is measured and measurement data are sent by the wireless transceiver E/R.
The measurement data determined by the microcontroller UC are the effective value of the electrical current I measured and the quantity of electrical power.

Mode 3—7≤I≤20 A
The current is measured over, for example, 30% of the operating cycle Te of the current sensor 10 (for example Te=2 s).
The measurement data are the effective value of the electrical current, the quantity of electrical power, the levels of certain harmonics, the moment of transition to zero current.
Operation in receive mode after a transmission: the sensor may switch to receive mode after a measurement data transmission. The sensor cannot remain listening permanently because that would consume too much power. Consequently, it switches to receive mode for a short determined period after a data transmission in order to be able to receive data from the central station 30. These data may, for example, be the effective value of the voltage, the power factor (cos phi) or an item of information associated with a period of transmission of the current sensor 10.

Mode 3.2
Mode equivalent to mode 3, except for the measurement period.
The current may be measured over 100% of its operating cycle, so long as the voltage at the terminals of the capacitor C1 is higher than or equal to the determined threshold of 5.1 V.
This operating mode is a transient mode allowing the current sensor 10 to switch from mode 3 to mode 2 via the intentional consumption of a certain quantity of power.

Mode 4—20≤I≤100 A
The electrical current I is measured over, for example, 50% of the operating cycle Te of the sensor (for example Te=2 s).
The measurement data determined by the microcontroller UC are the effective value of the electrical current I, the quantity of electrical power, the levels of certain harmonics, the moment of transition to zero current.
Operation in receive mode after a transmission.

Mode 5—100≤I≤700 A
The electrical current I is measured over 80% of the operating cycle Te of the sensor (for example Te=2 s).
The measurement data determined by the microcontroller UC are the effective value of the electrical current I, the quantity of electrical power, the levels of certain harmonics, the moment of transition to zero current.
Operation in receive mode after a transmission.

Stop Mode
When the current sensor 10 detects a sudden reduction in the value of the measured current, a measurement is taken and measurement data are transmitted instantaneously.

Figure 3:
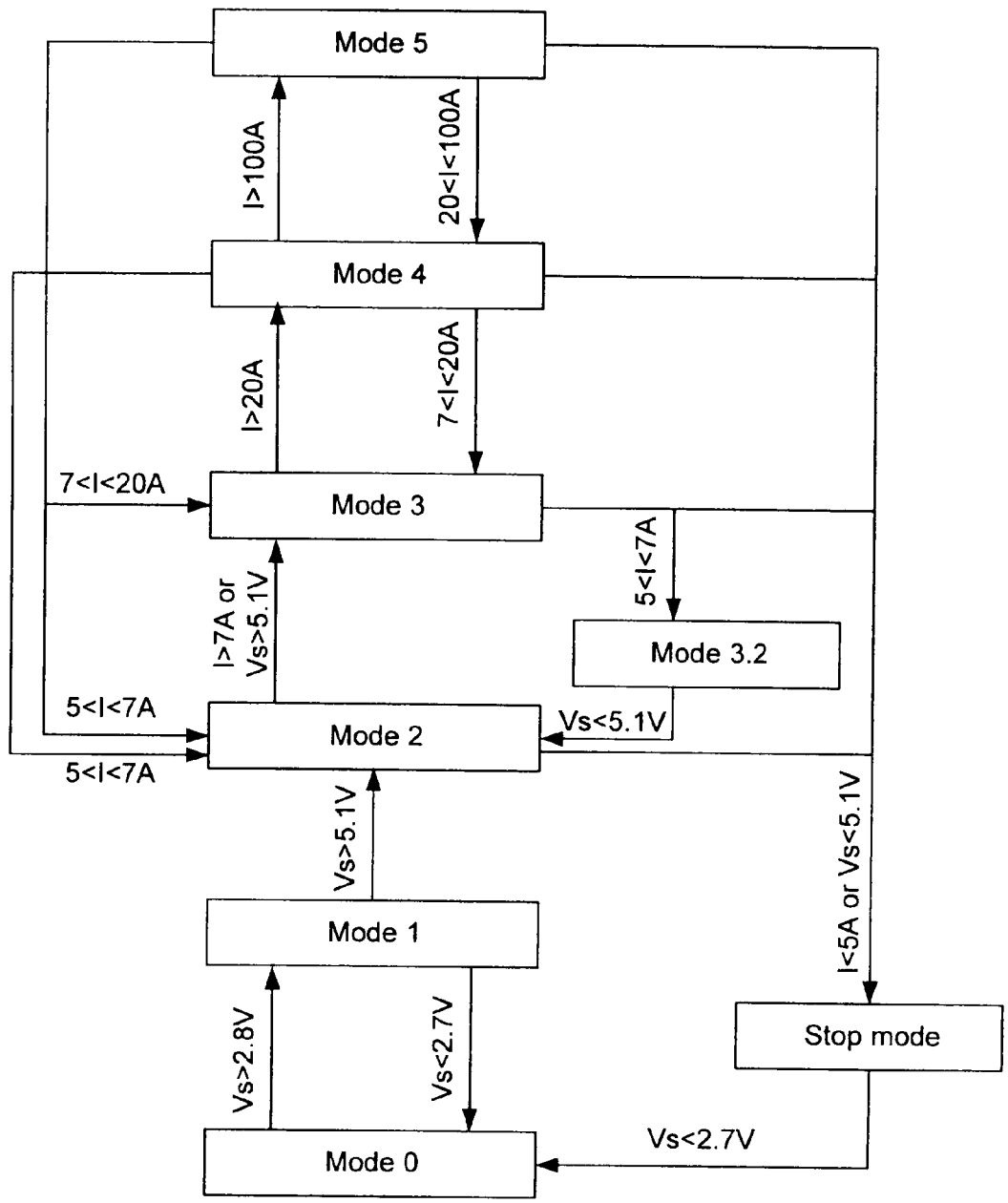
FIG. 3 shows the operating diagram of the current sensor of the invention according to the first embodiment.

The conditions of transition from one mode to the other are explained more precisely in FIG. 3 in association with the table below:

| Initial operating mode | Condition(s) | Final operating mode |
|---|---|---|
| 0 | Vs > 2.8 V | 1 |
| 1 | Vs > 5.1 V | 2 |
| 1 | Vs < 2.7 V | 0 |
| 2 | I > 7 A or Vs > 5.1 V after a transmission | 3 |
| 3 | 5 < I < 7 A | 3.2 |
| 3.2 | Vs < 5.1 V | 2 |
| 3 | I > 20 A | 4 |
| 4 | 7 < I < 20 A | 3 |
| 4 | I > 100 A | 5 |
| 4 | 5 < I < 7 A | 2 |
| 5 | 20 < I < 100 A | 4 |
| 5 | 7 < I < 20 A | 3 |
| 5 | 5 < I < 7 A | 2 |
| 2, 3, 4, 5 | I < 5 A or Vs < 5.1 V | Stop |
| Stop | Vs < 2.7 V | 0 |

In this first table, the numerical values of the voltages and of the currents are given as examples.

The second assembly shown in FIG. 4 allows a continuous operation in measuring and in charging. Relative to the first assembly, the second assembly does not use a switch to choose between the charging mode and the measuring mode. In this assembly, the "Latour" voltage doubler is again used and connected directly to the winding 101 of the secondary of the current transformer. The measurement resistor Rm is connected to the mid-point of the two capacitors. As in the first assembly, the two linear voltage regulators LDO are connected in parallel with the two capacitors C1, C2 and are used to regulate the supply of the microcontroller UC and of the wireless transceiver E/R. The voltage available at the terminals of one of the capacitors C1 is also monitored and sent to the microcontroller in order to permanently ascertain the voltage Vs and thus the available electrical power. Since the current is capable of being monitored permanently, this solution has the advantage of being able to detect a current defect. This functionality is applied by the detection of a sudden transition from a relatively high current (for example greater than 20 A) to a zero current.

For this second assembly, when the current cannot be measured permanently, an operating cycle of the sensor comprises:
charging time of the means for storing electrical power,
stabilization time of the measured current,
current measurement time,
radio transmission time.

When the current is measured over 100% of the operating cycle, all the other tasks are carried out in parallel by the microcontroller UC.

For this second assembly, the various operating modes are as follows:

Mode 0—I≈0
The electrical current I flowing in the electrical conductor 20 is too low to be able to supply the electronic circuit of the current sensor 10.

Mode 1—2≤I≤5 A
The electrical current I flowing in the electrical conductor 20 is low but sufficient to supply the electronic circuit of the current sensor 10, with the exception of the analog to digital converter (ADC).
No current measurement is carried out.
Periodic transmission by the wireless transceiver E/R that a low current is flowing in the electrical conductor.

Mode 2—5≤I≤7 A
The electrical current I flowing in the electrical conductor 20 becomes sufficient to supply the electronic circuit, including the analog to digital converter.
The current is measured over 30% of the operating cycle Te of the sensor (for example Te=2 s).
Each time that the voltage Vs at the terminals of the capacitor C1 is higher than a determined threshold, for example equal to 5.1 V, the current is measured and measurement data are sent by the wireless transceiver E/R.
The measurement data determined by the microcontroller UC are the effective value of the electrical current measured and the quantity of electrical power.

Mode 3—7≤I≤20 A
The current is measured over, for example, 30% of the operating cycle Te of the current sensor 10 (for example Te=2 s).
The measurement data determined by the microcontroller UC are the effective value of the electrical current, the quantity of electrical power, optionally the levels of certain harmonics, the moment of transition to zero current.

Operation in receive mode after a transmission: this operating mode is defined above for the first assembly.

Mode 3.2
Mode equivalent to mode 3, with the exception of the measurement period.
The current may be measured over 100% of its period so long as the voltage Vs at the terminals of the capacitor C1 is higher than or equal to the determined threshold of 5.1 V.
This operating mode is a transient mode allowing the current sensor 10 to switch from mode 3 to mode 2 by the intentional consumption of a certain quantity of energy.

Mode 4—20 I≤700 A
The current is measured over 100% of the operating cycle Te of the sensor (for example Te=2 s).
The measurement data determined by the microcontroller UC are the effective value of the electrical current, the quantity of electrical power, the levels of certain harmonics, the moment of transition to zero current.
Operation in receive mode after a transmission.

Mode 5—700 A≤I
Mode of detection of a current defect.
The current is measured over 100% of the operating cycle Te of the sensor with a very small sampling period Td making it possible to detect a current defect as quickly as possible. If, at each moment of the sampling period Td, the current remains positive, the sensor switches back to operating mode No. 4. On the other hand, if at a moment of the sampling period Td, the current becomes zero, a current defect is detected.

Mode 6—Current Defect—Alarm Message
A current defect has been detected.
Generation of an alarm message.

Stop Mode
When the current sensor 10 detects a sudden reduction in the value of the electrical current I measured, a measurement is taken and measurement data are transmitted instantaneously.

Figure 5:
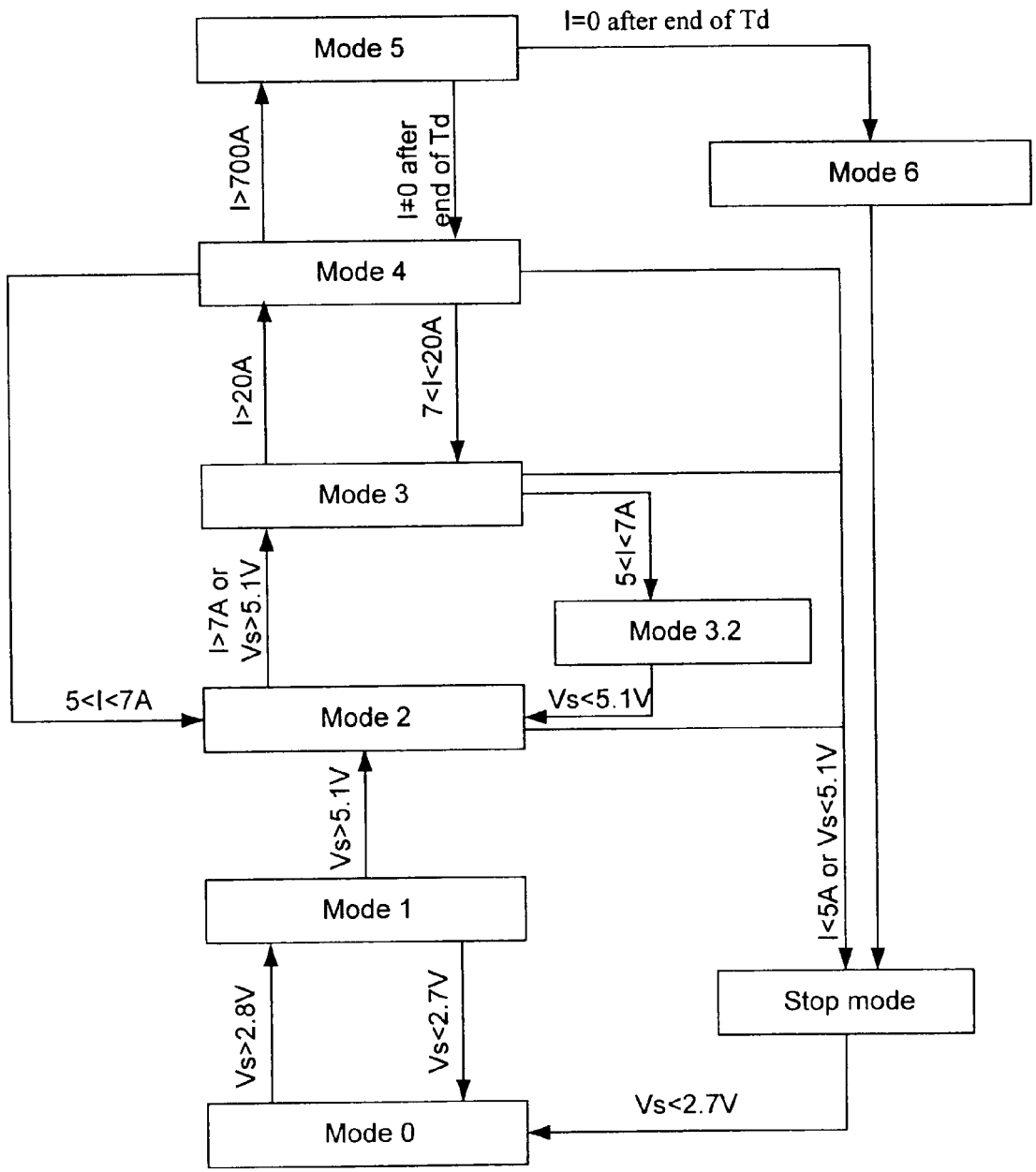
FIG. 5 shows the operating diagram of the sensor of the invention according to the second embodiment.

The conditions of transition from one mode to the other are explained more precisely in FIG. 5 in association with the table below:

| Initial operating mode | Condition(s) | Final operating mode |
|---|---|---|
| 0 | Vs > 2.8 V | 1 |
| 1 | Vs > 5.1 V | 2 |
| 1 | Vs < 2.7 V | 0 |
| 2 | I > 7 A or Vs > 5.1 V after a transmission | 3 |
| 3 | 5 < I < 7 A | 3.2 |
| 3.2 | Vs < 5.1 V | 2 |
| 3 | I > 20 A | 4 |
| 4 | 7 < I < 20 A | 3 |
| 4 | I > 700 A | 5 |
| 5 | I ≠ 0 after end of Td | 4 |
| 5 | I = 0 after Td | 6 |
| 4 | 5 < I < 7 A | 2 |
| 2, 3, 4, 6 | I < 5 A or Vs < 5.1 V | Stop |
| Stop | Vs < 2.7 V | 0 |

In this second table, the numerical values of the voltages and of the currents are given as examples.

The invention claimed is:
1. A wireless current sensor designed for measuring an electrical current flowing in an electrical conductor, the wireless current sensor comprising:
a current transformer including a core arranged around the electrical conductor forming a primary of the current transformer, and a winding around the core and forming a secondary of the current transformer in order to retrieve an electrical power when an electrical current flows in the electrical conductor, an electronic circuit connected to the secondary of the current transformer, the electronic circuit including:

means for storing the generated electrical power, means for measuring, including a microcontroller, the electrical current flowing in the electrical conductor based on the generated electrical power stored in the means for storing the generated electrical power and generating measurement data of the electrical current flowing in the electrical conductor, and a wireless data transceiver coupled to the microcontroller to send the measurement data, wherein the wireless current sensor is operable in at least two distinct operating modes, the two operating modes differing from one another by the measurement data generated by the microcontroller and by a duration of measurement of the electrical current flowing in the electrical conductor, and wherein the wireless current sensor further comprises means for determining transition from one operating mode to the other taking account of a value of the measured electrical current.

2. The wireless current sensor according to claim 1, further comprising:

means for detecting a sudden reduction in the value of the measured electrical current; and means for activating the wireless transceiver to send the measurement data when the sudden reduction is detected.

3. The wireless current sensor according to claim 1 or 2, wherein the means for storing the generated electrical power includes a voltage doubler device having two capacitors and two diodes.

4. The wireless current sensor according to claim 1, wherein the core of the current transformer takes the form of a torus positioned around the electrical conductor.

5. The wireless current sensor according to claim 4, wherein the torus is openable.

6. The wireless current sensor according to claim 1, wherein the electronic circuit includes means for selecting between a charging mode in which the electrical power is stored in the means for storing electrical power and a measuring mode in which the electrical power is used to measure the current, determine the measurement data and send the measurement data.

7. The wireless current sensor according to claim 6, wherein the selection means includes two transistors connected together via their respective drains and each is furnished with a diode mounted between the drain and the source.

8. The wireless current sensor according to claim 7, wherein the means for measuring includes a measurement resistor connected in series with the two transistors and in parallel with the means for storing the generated electrical power.

9. The wireless current sensor according to claim 1, wherein the means for measuring includes a measurement resistor connected in series with the means for storing the generated electrical power.

10. The wireless current sensor according to claim 9, wherein the wireless current sensor is operable in an operating mode for detection of a current defect.

11. The wireless current sensor according to claim 1, wherein, in a determined operating mode, the wireless current sensor switches, for a determined period, the wireless transceiver into a receiving mode after a transmission of measurement data, in order to receive data originating from a central station.

* * * * *